(12) United States Patent
Farquhar, III et al.

(10) Patent No.: US 9,784,785 B2
(45) Date of Patent: Oct. 10, 2017

(54) METHOD OF DETECTING METAL OXIDE VARISTOR (MOV) FAILURE WITHIN A SURGE PROTECTION DEVICE

(71) Applicant: ASCO Power Technologies, L.P., Florham Park, NJ (US)

(72) Inventors: Louis A. Farquhar, III, Seminole, FL (US); Michael J. Gerlach, Riverview, FL (US)

(73) Assignee: ASCO Power Technologies, L.P., Florham Park, NJ (US)

( * ) Notice: Subject to any disclaimer, the term of this patent is extended or adjusted under 35 U.S.C. 154(b) by 111 days.

(21) Appl. No.: 14/564,208

(22) Filed: Dec. 9, 2014

(65) Prior Publication Data
US 2016/0161547 A1    Jun. 9, 2016

(51) Int. Cl.
H02H 9/04 (2006.01)
G01R 31/28 (2006.01)
G01K 13/00 (2006.01)
H02H 1/00 (2006.01)

(52) U.S. Cl.
CPC ......... G01R 31/2827 (2013.01); G01K 13/00 (2013.01); H02H 1/0007 (2013.01); H02H 9/042 (2013.01)

(58) Field of Classification Search
CPC .... G01R 31/2827; H02H 9/041–9/042; H02H 1/0007
See application file for complete search history.

(56) References Cited

U.S. PATENT DOCUMENTS 6,535,369 B1 * 3/2003 Redding ................ H01C 7/126
                                                361/111
7,453,368 B2 * 11/2008 Baldwin .............. H02H 1/0053
                                                338/21

* cited by examiner

Primary Examiner — Stephen W Jackson
Assistant Examiner — Christopher Clark
(74) Attorney, Agent, or Firm — McDonnell Boehnen Hulbert & Berghoff LLP (57) ABSTRACT

An example method for monitoring the operation of a metal-oxide varistor (MOV) may involve monitoring an operating value of at least one parameter of the MOV using at least one sensor. Further, the method may involve determining, using one or more processors, that a difference between the operating value and a reference value corresponding to the at least one parameter satisfies a predetermined threshold condition corresponding to the at least one parameter. And the method may involve responsive to determining that the difference between the operating value and the reference value satisfies the predetermined threshold condition, transmitting a notification indicative of a potential failure of the MOV to at least one device.

26 Claims, 7 Drawing Sheets

| PARAMETER | REFERENCE VALUE | THRESHOLD CONDITION |
|---|---|---|
| TEMPERATURE | AMBIENT TEMPERATURE | DIFFERENCE BETWEEN TEMPERATURE AND AMBIENT TEMPERATURE BEING GREATER THAN THRESHOLD |
| CURRENT FLOW | REFERENCE CURRENT FLOW | DIFFERENCE BETWEEN CURRENT FLOW AND REFERENCE CURRENT FLOW BEING GREATER THAN THRESHOLD |
| CURRENT FLOW | CURRENT THRESHOLD | CURRENT FLOW BEING GREATER THAN CURRENT THRESHOLD |
| CONDUCTION VOLTAGE | REFERENCE CONDUCTION VOLTAGE | DIFFERENCE BETWEEN CONDUCTION VOLTAGE AND REFERENCE CONDUCTION VOLTAGE BEING GREATER THAN THRESHOLD |
| CONDUCTION VOLTAGE | NOMINAL VOLTAGE | CONDUCTION VOLTAGE BEING LESS THAN NOMINAL VOLTAGE |

COMPUTER PROGRAM PRODUCT 700

SIGNAL BEARING MEDIUM 701

PROGRAM INSTRUCTIONS 702

- MONITORING AN OPERATING VALUE OF AT LEAST ONE PARAMETER OF AN MOV USING AT LEAST ONE SENSOR;

- DETERMINING THAT A DIFFERENCE BETWEEN THE OPERATING VALUE AND A REFERENCE VALUE CORRESPONDING TO THE AT LEAST ONE PARAMETER SATISFIES A PREDETERMINED THRESHOLD CONDITION CORRESPONDING TO THE AT LEAST ONE PARAMETER; AND

- RESPONSIVE TO DETERMINING THAT THE DIFFERENCE BETWEEN THE OPERATING VALUE AND THE REFERENCE VALUE SATISFIES THE PREDETERMINED THRESHOLD CONDITION, TRANSMITTING A NOTIFICATION INDICATIVE OF A POTENTIAL FAILURE OF THE MOV TO ANOTHER DEVICE.

| COMPUTER READABLE MEDIUM 703 | COMPUTER RECORDABLE MEDIUM 704 | COMMUNICATIONS MEDIUM 705 |

METHOD OF DETECTING METAL OXIDE VARISTOR (MOV) FAILURE WITHIN A SURGE PROTECTION DEVICE

BACKGROUND

A varistor is an electronic component having a "diode-like" nonlinear current-voltage characteristic. The name "varistor" is a combination of the two words "variable" and "resistor". However, a varistor may also be referred to as a voltage-dependent resistor (VDR). As the names imply, a varistor has a resistance or impedance that varies as a function of voltage. Generally, at low voltages a varistor may exhibit a high resistance or impedance, and at high voltages the varistor may exhibit a low resistance or impedance. Because of this behavior, varistors are often used to protect circuits against excessive transient voltages, commonly known as surges. For example, one or more varistors may be incorporated into a circuit in a particular manner, such that, when an overvoltage or surge occurs, the one or more varistors redirect any current created by the high voltage away from sensitive components.

One common type of varistor is the metal-oxide varistor (MOV). An MOV is generally composed of metal oxide materials (e.g., zinc, bismuth, cobalt, manganese, etc.) inserted between two conductive metallic electrode plates. Many surge protection devices (SPDs) include internal MOV suppression components to protect against transient overvoltages resulting from a lightning strike or other event. In practice, each plate of an MOV may be connected to a different conductor. Depending on the desired system configuration and surge protection, each plate may be connected to a particular electrical pole, phase, neutral, or ground. By way of example, a three phase SPD may include line-to-neutral ("L-N") MOVs connected phase A to neutral, phase B to neutral, and/or phase C to neutral; neutral-to-ground ("N-G") MOVs connected neutral to ground; line-to-ground ("L-G") MOVs connected phase A to ground, phase B to ground, and/or phase C to ground; and/or line-to-line ("L-L") MOVs connected phase A to phase B, phase B to phase C, and/or phase C to phase A. Each configuration is commonly referred to as a mode of protection.

During normal operating voltages, an MOV exhibits high impedance with low leakage current. Thus, during normal operating voltages, the MOV provides electrical isolation between two conductors to which the electrode plates are connected. On the other hand, during an overvoltage condition, the MOV rapidly decreases impedance, which permits the overvoltage to flow through the MOV as current. Thus, during an overvoltage condition, the MOV redirects surge energy away from one conductor to another conductor, thereby equalizing voltage and protecting sensitive loads. By definition, transient overvoltages or surges are momentary, short duration events. After the overvoltage concludes, the MOV resets itself back to a high impedance state and awaits future surges.

When sized appropriately, MOVs are generally able to control hundreds or thousands of surges. In some instances, multiple MOVs may be installed in electrically-parallel configurations in the same mode of protection. This may offer various benefits, including but not limited to: increased surge capacity, lower let-through voltage performance, increased robustness and redundancy, etc.

SUMMARY

In one example aspect, a method for monitoring the operation of an MOV is provided. The method involves monitoring an operating value of at least one parameter of the MOV using at least one sensor. The method also involves determining, using one or more processors, that a difference between the operating value and a reference value corresponding to the at least one parameter satisfies a predetermined threshold condition corresponding to the at least one parameter. And the method involves responsive to determining that the difference between the operating value and the reference value satisfies the predetermined threshold condition, transmitting a notification indicative of a potential failure of the MOV to at least one device In another example aspect, an apparatus for monitoring the operation of an MOV is provided. The apparatus includes at least one sensor configured to monitor an operating value of at least one parameter of the MOV, a communication interface through which the apparatus is configured to transmit notifications, and a controller. The controller is arranged to: (i) determine that a difference between the operating value and a reference value corresponding to the at least one parameter satisfies a predetermined threshold condition corresponding to the at least one parameter, and (ii) cause the apparatus to transmit a notification indicative of a potential failure of the MOV to at least one device in response to determining that the difference between the operating value and the reference value satisfies the predetermined threshold condition.

In still another example aspect, a non-transitory computer-readable medium having stored therein instructions, that when executed by one or more processors of a computing device, cause the computing device to perform functions is provided. The functions include monitoring an operating value of at least one parameter of an MOV using at least one sensor. The functions also include determining that a difference between the operating value and a reference value corresponding to the at least one parameter satisfies a predetermined threshold condition corresponding to the at least one parameter. And the functions include responsive to determining that the difference between the operating value and the reference value satisfies the predetermined threshold condition, transmitting a notification indicative of a potential failure of the MOV to another device.

The foregoing summary is illustrative only and is not intended to be in any way limiting. In addition to the illustrative aspects, embodiments, and features described above, further aspects, embodiments, and features will become apparent by reference to the figures and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

MOV failure generally occurs from either comparatively sustained overvoltages or from surges having substantially more energy than an MOV can handle. In some examples, MOV failure may result in an increase in leakage current or continuous current. For instance, during various electrical system anomalies and/or malfunctions, there is a possibility of comparatively sustained overvoltages, which may also be referred to as temporary overvoltages. During a sustained overvoltage, an MOV may sense the overvoltage, reduce impedance, and conduct current, much the same as conducting a transient overvoltage. However, the resulting sustained current conduction may generate internal thermal stresses within the MOV's semiconductor material such that it fails permanently to a lower impedance. By way of example, the MOV may be unable to reset itself to high impedance, leading to increased current flow through the MOV continuously.

Further, continuous current flow through a failed MOV may cause the MOV to generate heat. The amount of heat may be proportional to the square of the current through the MOV and linearly proportional to the impedance of the MOV. If the physical configuration of the MOV permits dissipation of the generated heat, the MOV may reach an equilibrium temperature where internal MOV heat generation is less than or equal to the rate of heat dissipation. But if the MOV generates more heat than can be dissipated, the MOV may achieve higher temperatures. If the MOV increases in temperature slowly, the MOV may catch fire and/or overheat adjacent materials. And if the MOV increases rapidly in temperature, the MOV may even exhibit spontaneous exothermic disassembly (i.e., explode).

Additionally or alternatively, MOV failure may result in an increase or decrease in conduction voltage level. Generally, an MOV is rated at a particular conduction voltage level. Ideally, when the voltage level applied across the MOV is less than the rated conduction voltage, the MOV has a high impedance. But when the voltage level applied across the MOV is more than the rated conduction voltage, the MOV instantaneously (e.g., within nanoseconds) exhibits a low impedance. In some examples, after experiencing a transient overvoltage or sustained overvoltage, an MOV's conduction voltage may not return to an original and intended conduction voltage. For instance, the MOV's conduction voltage may instead return to a lower conduction voltage, which may allow current to flow through the MOV. As a particular example, a 120V power system may use an MOV having a 150V conduction voltage. If, due to imminent failure, the MOV decreases its conduction voltage to 110V, then the 120V power system may cause the MOV to draw current. This current draw may in turn trigger the heat issues described above.

In scenarios in which an MOV is installed in a SPD, MOV failure may particularly be undesirable due to the possibility of SPD failure. For instance, an SPD failure may cause an unwanted escalation of power system problems or cause system downtime. Although failing SPDs and their internal MOVs may cause undesirable collateral consequences, these consequences may be avoidable with appropriate advanced notification of impending MOV/SPD failure.

Accordingly, example devices, systems, and methods disclosed herein relate to detecting changes in one or more parameters of an MOV in a manner that predicts the onset of MOV failure for informational use. For instance, the systems and methods may allow for predictive and/or real-time diagnosis of MOV failure that may provide an SPD user with the ability to determine suitable courses of action.

As an example, the systems and methods may monitor an MOV and provide an SPD user with a notification of an aging or underperforming MOV such that the user may elect to replace the MOV. In some instances, if the notification is provided during a valuable process whereby a user may not reasonably have time to affect an outcome, the notification may trigger one or more predetermined actions (e.g., actions that implement a safety-related SPD-failure scenario that a user may not have sufficient time to affect). Additionally, in some instances, an SPD user that is informed by the notification of the potential failure may then elect subsequent actions in a manner that minimizes otherwise unavoidable losses.

An example method for monitoring operation of an MOV may involve monitoring an operating value of at least one parameter of the MOV using at least one sensor. By way of example, a monitoring component or device may use one or more sensors to monitor one or more parameters of the MOV, such as a temperature of the MOV, a current flow through the MOV, and/or a conduction voltage of the MOV.

As part of the example method, one or more processors may determine that a difference between the operating value and a reference value corresponding to the at least one parameter satisfies a predetermined threshold condition corresponding to the at least one parameter. As one example, the monitoring component may monitor a temperature of the MOV, and the predetermined threshold condition may include the difference between the operating value of the temperature of the MOV and an ambient temperature being greater than a predetermined threshold. As further described below, depending on the particular parameter(s) monitored by the monitoring component, the predetermined threshold condition may verify. Thus, the example is not meant to be limiting.

Further, the example method may also involve, responsive to determining that the difference between the operating value and the reference value satisfies the predetermined threshold condition, transmitting a notification indicative of a potential failure of the MOV to at least one device. For instance, the monitoring component may transmit a notification to a computing device of an SPD user. Generally, an SPD user may include a user that uses an SPD to provide surge protection for one or more devices or a user that monitors the status of an SPD. Thus, the computing device of the SPD user may, for example, refer to a computing device protected by the SPD or a computing device of a user that monitors the status of the SPD.

Within examples, the described systems and methods may allow for MOV or SPD disconnection (e.g., by automated or manual means); immediate status indication for informational purposes; diagnostic monitoring of MOV(s) or collective SPD health; analytical monitoring of MOV(s) or collective SPD health; estimation of future useful life of MOV(s) or collective SPD health; determination of localized heat and related heat dissipation per MOV(s) or collective SPD; determination of power system anomalies; among other possible applications. Various functionalities of the systems and methods discussed above are described hereinafter with reference to the accompanying figures.

Figure 1A:
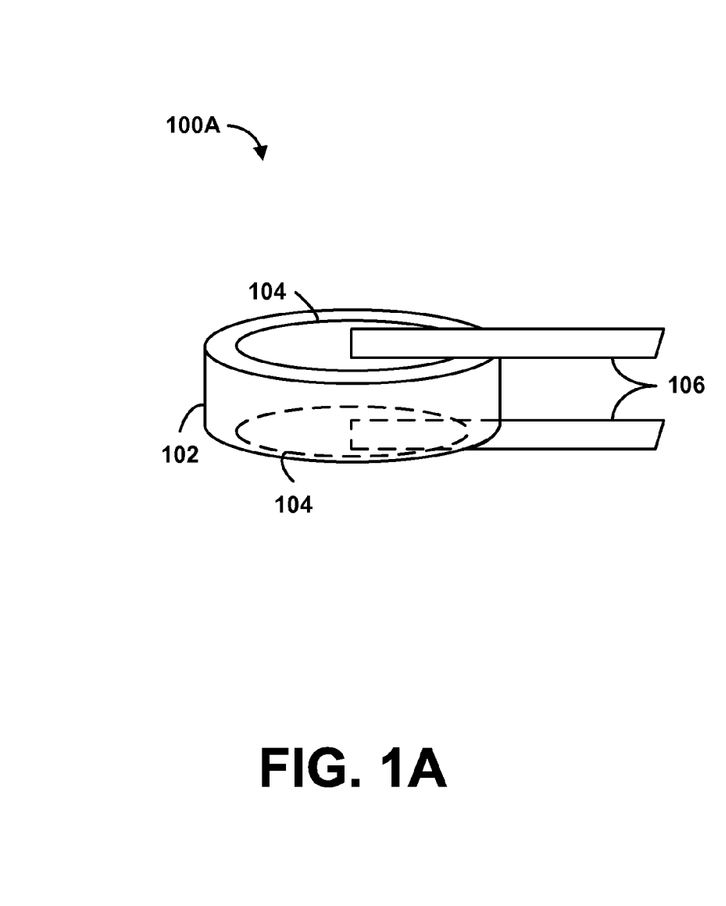
FIGS. 1A and 1B are conceptual illustrations of example MOVs.
Figure 1B:
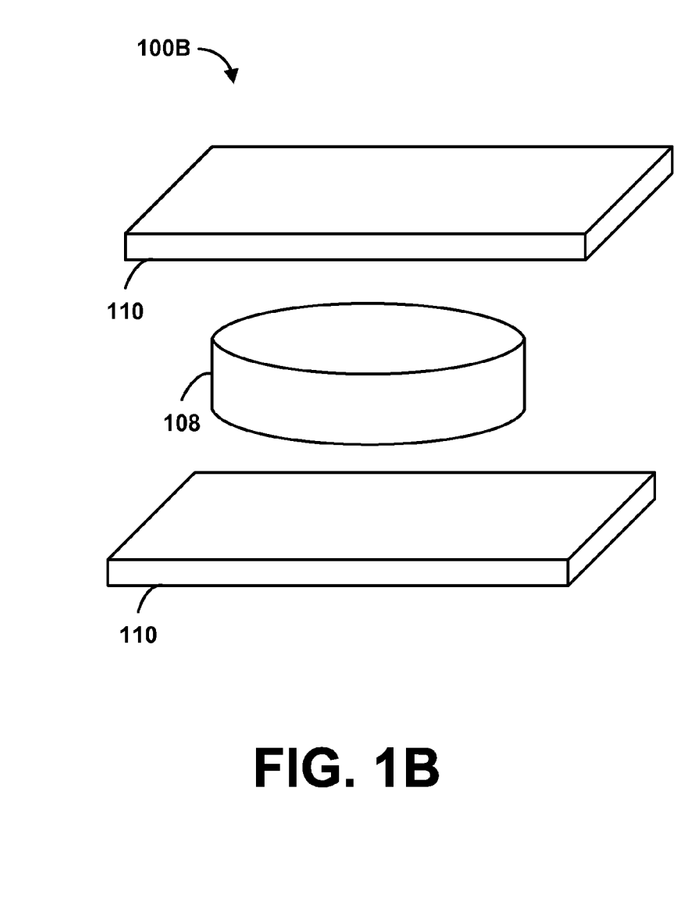

Referring now to the Figures, FIGS. 1A and 1B are conceptual illustrations 100A, 100B of example MOVs. As depicted in the conceptual illustration 100A of FIG. 1A, in one example configuration, an MOV may include a metal-oxide wafer 102 positioned between two metallic plates 104. Further, the MOV may include electrical leads 106 connected to the metallic plates 104. As discussed above, the metal-oxide wafer 102 may include one or more metal oxide materials, such as zinc, bismuth, cobalt, manganese, etc.). The metallic plates 104 may be conductive metallic electrode plates. In practice, each of the electrical leads 106 may be coupled to a particular electrical pole, phase, neutral, ground, etc., depending on the desired system configuration and surge protection. In some instances, the MOV may be covered with an epoxy or similar coating (not shown).

As depicted in the conceptual illustration 100B of FIG. 1B, in another example configuration, an MOV may include a metal-oxide wafer 108 positioned between two metallic plates 110. For purposes of illustration, an exploded view of the components is shown. The metal-oxide wafer 108 may include one or more metal-oxide materials, and the metallic plates 110 may be conductive metallic electrode plates.

Figure 2:
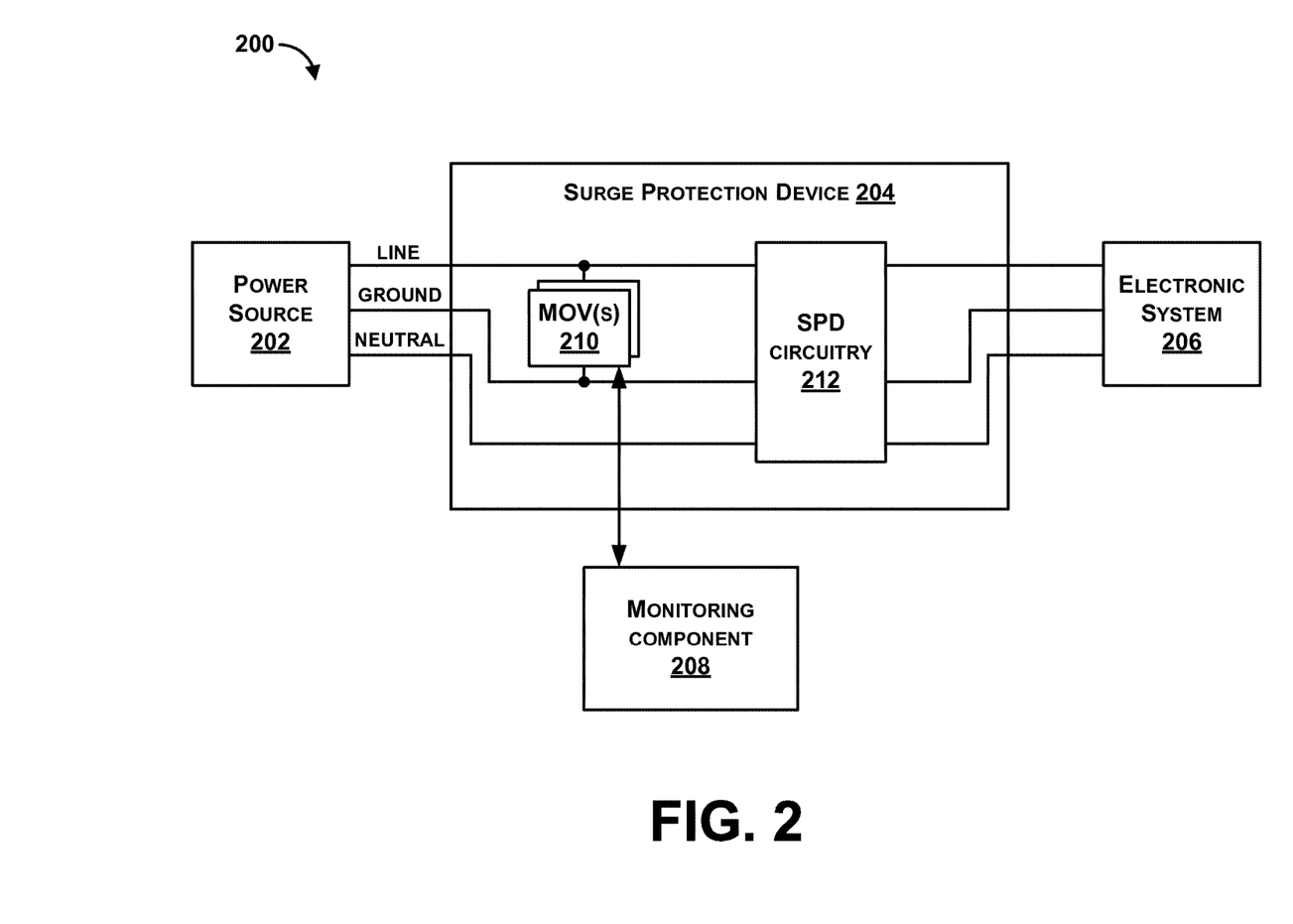
FIG. 2 is a block diagram illustrating an example system in which the present disclosure can be implemented.

FIG. 2 is a block diagram illustrating an example system 200 in which the present disclosure can be implemented. More specifically, the example system 200 includes a power source 202 connected to an SPD 204 that is configured to protect an electronic system 206. Additionally, the system 200 includes a monitoring component 208 that is configured to monitor operation of one or more MOVs 210 of the surge protection device 204.

In one example, the power source 202 may be an alternating-current (AC) power source that provides AC electric power. For instance, the power source 202 may provide alternating current on a line wire (also known as live, phase, or hot). In another example, the power source 202 may provide three-phase electrical power. Thus, the voltage and frequency of the power source 202 may vary. In still another example, the power source 202 may be a direct-current (DC) power source that provides DC electric power.

The SPD 204 may be configured to protect the electronic system 206 from transient overvoltages, such as voltage spikes due to lightning strikes, for instance. In practice, the SPD 204 may be configured to attempt to limit the voltage supplied to the electronic system 206 by either blocking or shorting to ground any unwanted voltages above a safe threshold. For instance, the SPD 204 may be configured to protect the electronic system 206 against voltage spikes that are greater than a clamping voltage or let-through voltage. As examples, the clamping voltage of the SPD 204 may be 330V, 400V, or 500V.

In one example, the SPD 204 may include a single MOV 210 installed in a single mode of protection. In another example, the SPD 204 may include multiple MOV(s) 210 installed in electrically-parallel configurations in a single mode of protection, or perhaps multiple modes or protection. For example, two or more MOVs may be configured in one or more arrays.

In addition to the one or more MOV(s) 210, the SPD 204 may include additional SPD circuitry 212 that is wired to perform SPD functions to protect the electronic system 206.

The electronic system 206 may include any type of electronic system or device(s) configured to operate using electrical power provided by the power source 202. By way of example, the electronic system 206 may include any type of computing device. In some instances, the computing device may be configured to carry out one or more military, medical, or financial actions.

Figure 3:
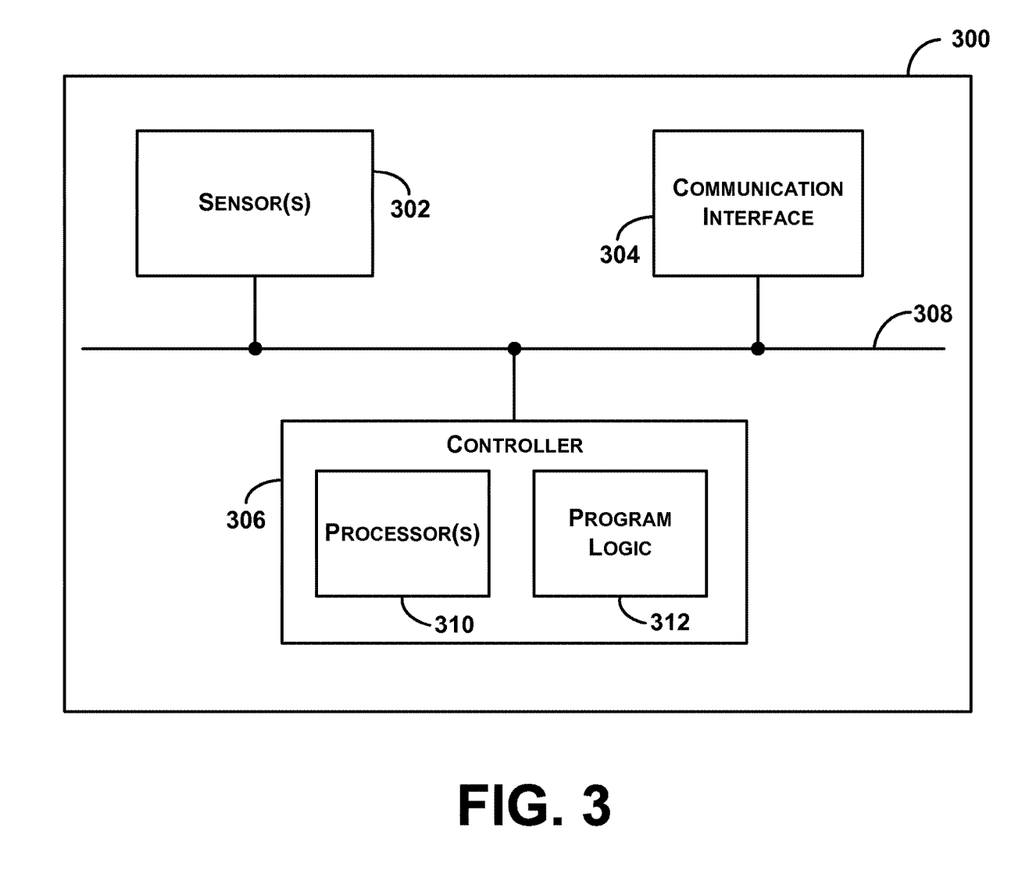
FIG. 3 is a block diagram of an example apparatus for monitoring the operation of an MOV.

The monitoring component 208 may be a device or apparatus including one or more functional or physical components configured to carry out the various monitoring functions described herein. By way of example, FIG. 3 is a block diagram of an example apparatus 300 for monitoring the operation of an MOV. As shown in FIG. 3, the example apparatus 300 may include one or more sensors 302, a communication interface 304, and a controller 306 that may all be linked together by a communication link 308 (e.g., a wired or wireless link).

The sensors 302 may include sensors configured to monitor an operating value of one or more parameters of the MOV. For instance, the sensors 302 may include one or more temperature sensors configured to monitor a temperature of the MOV, such as a thermocouple, thermistor, silicon bandgap temperature sensor, infrared temperature sensor, or other type of temperature sensor. Further, the sensors 302 may include one or more temperature sensors configured to monitor an ambient temperature of an environment of an MOV.

Additionally or alternatively, the sensors may 302 may include one or more current sensors configured to monitor a current flow through the MOV. For instance, the current sensor may be configured to detect an AC or DC electrical current flowing between two plates of an MOV and generate a signal that is proportional to the measured current. The generated signal may be an analog voltage or current, or perhaps a digital output. Further, the sensors 302 may include one or more voltage sensors configured to monitor a conduction voltage of the MOV between two plates of the MOV.

In some examples, the sensors 302 may be separate from the apparatus 300 and configured to provide signals to the apparatus via a wired or wireless communication link.

The communication interface 304 may be configured to allow the apparatus to communicate with another device (not shown), such as a computing device. Thus, the communication interface 304 may be configured to receive input data from one or more computing devices, and may also be configured to send output data to the one or more computing devices.

In practice, the communication interface 304 may be configured to operate according to one or more wired or wireless communication standards. For example, the communication interface 304 may include a Wi-Fi communication component that is configured to facilitate wireless data communication according to one or more IEEE 802.11 standards. As another example, the communication interface 304 may include a Bluetooth communication component that is configured to facilitate wireless data communication according to one or more Bluetooth standards. As still another example, the communication interface 304 may include one or any combination of serial communication ports or parallel communication ports. Other examples are also possible.

The controller 306 may be configured to carry out various monitoring functions described herein. In one example, the controller 306 may include one or more processors 310 and stored program logic 312. The one or more processors 310 may include any type of processors, such as a microprocessor, microcontroller, digital signal processor, or any combination thereof. Additionally, the one or more processors 310 may include one or more levels of caching, a processor core, and registers.

In turn, the program logic 312 may include, for example, machine language instructions, which may be executable by the one or more processors 310 to carry out various monitoring functions described herein. For instance, program logic 312 may be executable to cause the controller 306 to monitor an operating value of at least one parameter of an MOV. Further, program logic 312 may be executable to cause the controller 306 to determine whether or not a difference between the operating value and a reference value corresponding to the at least one parameter satisfies a predetermined threshold condition. The program logic 312 may be stored in any type of memory of the controller (not shown), such as volatile memory, non-volatile memory, or any combination thereof.

Figure 4:
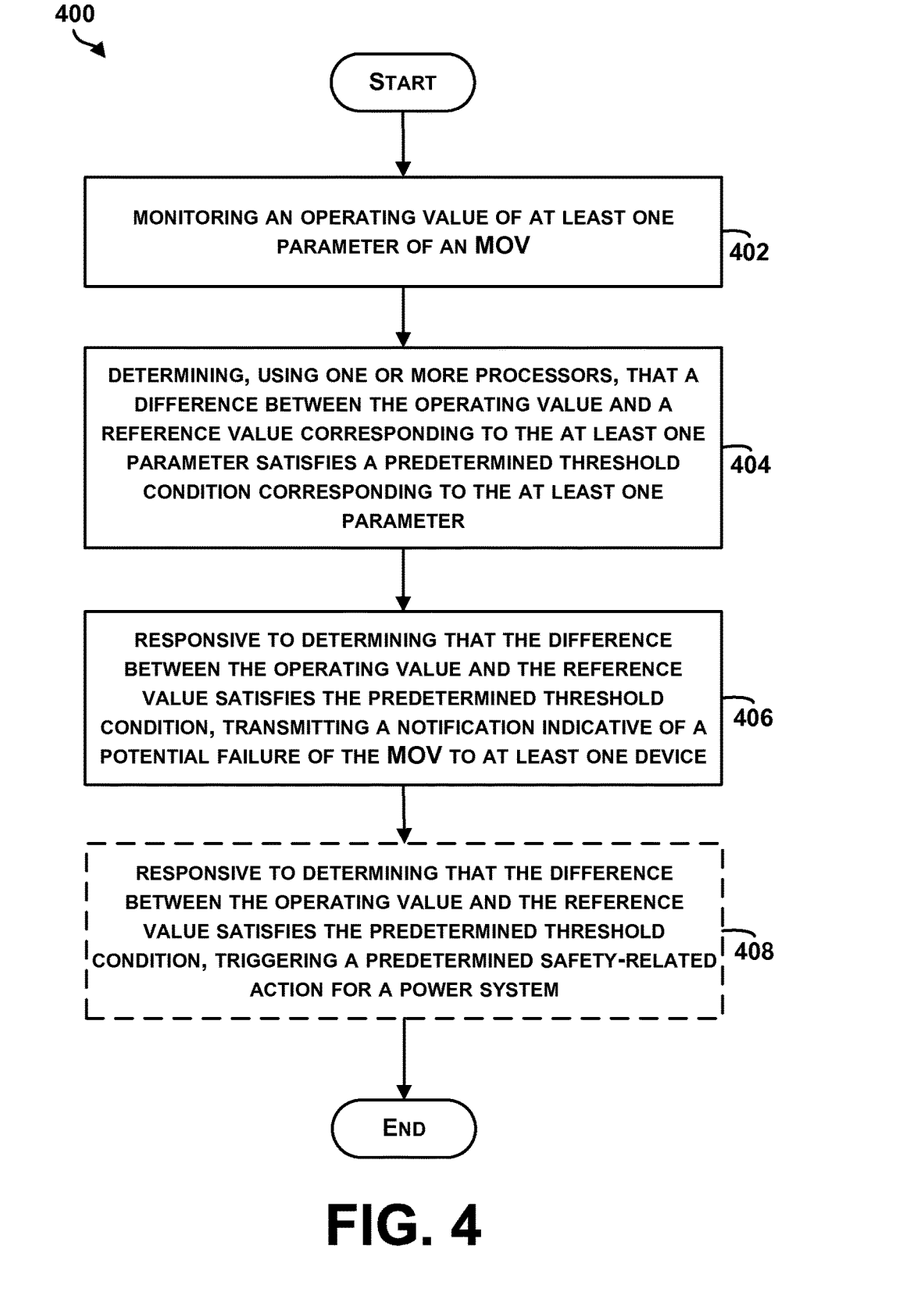
FIG. 4 is a flow chart of an example method for monitoring the operation of an MOV.

FIG. 4 is a flow chart of an example method 400 for monitoring the operation of an MOV. Method 400 shown in FIG. 4 presents an embodiment of a method that could be performed by the monitoring component 208 of FIG. 2 or one or more components of the monitoring component 208, for example, or generally by any computing device. It should be understood that for this and other processes and methods disclosed herein, the flowchart shows functionality and operation of one possible implementation of present embodiments. In this regard, each block may represent a module, a segment, or a portion of program code, which includes one or more instructions executable by a processor or computing device for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and random access memory (RAM). The computer readable medium may also include non-transitory media, such as secondary or persistent long term storage, like read only memory (ROM), optical or magnetic disks, or compact-disc read only memory (CD-ROM), for example. The computer readable media may also be any other volatile or non-volatile storage systems. The computer readable medium may be considered a computer readable storage medium, for example, or a tangible storage device.

In addition, for the method 400 and other processes and methods disclosed herein, each block may represent circuitry that is wired to perform the specific logical functions in the process. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

Initially, as shown at block 402, the method 400 involves monitoring an operating value of at least one parameter of an MOV. In one example, the parameter may be a temperature of the MOV. In another example, the parameter may be a current flow through the MOV. In still another example, the parameter may be a conduction voltage of the MOV.

In some instances, a monitoring component may include or use one or multiple sensors to simultaneously monitor one or multiple parameters of an MOV. For instance, a monitoring component may include one or more sensors and the monitoring component may be included within a SPD in which the MOV is installed. Alternatively, one or more sensors may be included within an SPD, and the one or more sensors may provide one or more signals to a monitoring component that is separate from the SPD. For instance, the one or more sensors may each provide a signal that is indicative of an operating value of a parameter of the MOV to the monitoring component using a wired or wireless communication link.

At block 404, the method 400 involves determining, using one or more processors, that a difference between the operating value and a reference value corresponding to the at least one parameter satisfies a predetermined threshold condition corresponding to the at least one parameter. In one example, the one or more processors may determine whether the difference satisfies the predetermined threshold condition whenever a new measurement of the operating value is received. In another example, the one or more processors may periodically, on an interval basis, determine whether the difference satisfies the predetermined threshold condition.

Depending on the particular parameter being monitored, the reference value corresponding to the at least one parameter as well as the predetermined threshold condition corresponding to the at least one parameter may vary.

Figure 5:
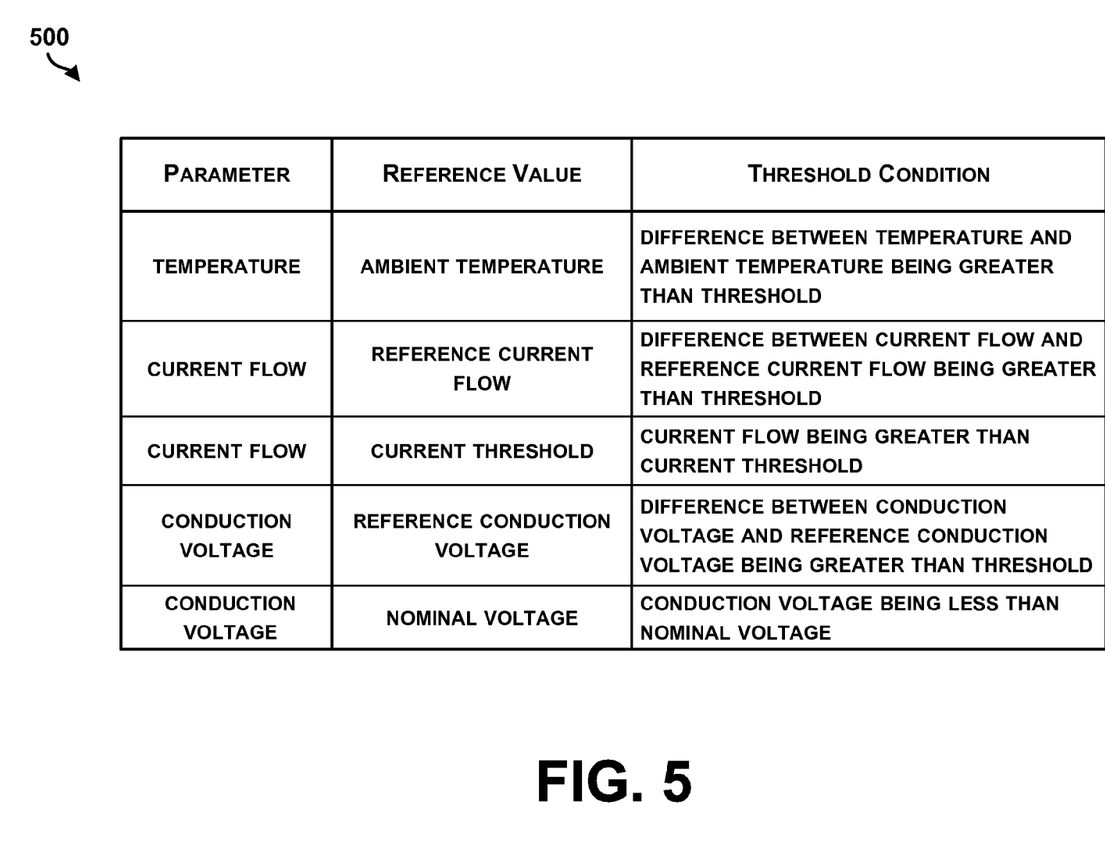
FIG. 5 is a table illustrating example reference values and example threshold conditions corresponding to parameters of an MOV.

By way of example, FIG. 5 is a table 500 illustrating example reference values and example threshold conditions corresponding to parameters of an MOV. As shown in the table 500 of FIG. 5, in one instance, the parameter may be a temperature of the MOV and the reference value may be an ambient temperature. In this scenario, an increase in the temperature of the MOV with respect to the ambient temperature may be indicative of an overheating MOV and impending MOV failure. Consequently, the threshold condition in this scenario may be the difference between the temperature of the MOV and the ambient temperature being greater than a threshold.

For instance, if the temperature of the MOV is five degrees greater than the ambient temperature, and the threshold is three degrees, a monitoring component may determine that the difference satisfies the predetermined threshold condition. On the other hand, if the difference between the temperature of the MOV and the ambient temperature is not greater than the three-degree threshold, the monitoring component may determine that the difference does not satisfy the threshold condition.

In another instance, the parameter may be a current flow of the MOV and the reference value may be a reference current flow through a reference MOV known to be operating in a desired manner. By way of example, the reference current flow through a reference MOV may be a current flow through a reference MOV that is new or a reference MOV that has only been used for testing, as opposed to an MOV that has been installed in an SPD and used for surge protection. Depending on the size and number of MOVs, current flow of the MOV is typically in the microamp range. In this scenario, an increase in steady-state MOV current flow may be indicative of impending MOV failure. Similarly, a substantial increase in steady-state current may suggest real-time MOV failure. Consequently, the threshold condition in this scenario may be the difference between the current flow through the MOV and the reference current flow being greater than a threshold.

For instance, if the difference between the current flow and the reference current flow is 100 microamps and the threshold is 50 microamps, a monitoring component may determine that the difference satisfies the predetermined threshold condition. On the other hand, if the difference between the current flow and the reference current flow is not greater than 50 microamps, the monitoring component may determine that the difference does not satisfy the predetermined threshold.

In still another instance, the parameter may be a current flow of the MOV and the reference value may be a current threshold. By way of example, the current threshold may be a number of microamps. Further, the threshold condition in this scenario may be the current flow through the MOV being greater than the current threshold.

For instance, if the current flow is 100 microamps and the current threshold is 50 microamps, a monitoring component may determine that predetermined threshold condition is satisfied. On the other hand, if the current flow is less than 50 microamps, the monitoring component may determine that the predetermined threshold condition is not satisfied.

In still another instance, the parameter may be a conduction voltage of the MOV and the reference value may be a reference current flow through a reference MOV known to be operating in a desired manner. By way of example, the reference conduction voltage of the reference MOV may be a conduction voltage of a reference MOV that is new or a reference MOV that has only been used for testing, as opposed to an MOV that has been installed in an SPD and used for surge protection. Generally, the conduction voltage of an MOV that is operating properly should be above the nominal voltage. If an MOV fails or begins to fail, the MOV may begin conducting, which can pull down the conduction voltage of one or more other MOVs. This decrease in conduction voltage can be measured and detected. Consequently, the threshold condition in this scenario may be the difference between the conduction voltage and the reference conduction voltage being greater than a threshold.

For instance, if the difference between the conduction voltage of the MOV and the reference conduction voltage is 10 volts and the threshold is 5 volts, a monitoring component may determine that the difference satisfies the predetermined threshold condition. On the other hand, if the difference between the conduction voltage and the reference conduction voltage is not greater than 5 volts, the monitoring component may determine that the difference does not satisfy the predetermined threshold.

In yet another instance, the parameter may be a conduction voltage of the MOV and the reference value may be a nominal voltage. By way of example, the nominal voltage may be a voltage at which an electronic system protected by an SPD operates (e.g., 120V, 240V, etc.). Further, the threshold condition in this scenario may be the conduction voltage being less than the nominal voltage.

For instance, if the conduction voltage is 110V and the nominal voltage is 120V, a monitoring component may determine that the predetermined threshold condition is satisfied. On the other hand, if the conduction voltage is 150V and the nominal voltage is 120V, the monitoring component may determine that the threshold condition is not satisfied.

Continuing with the method 400 of FIG. 4, at block 406, the method 400 involves responsive to determining that the difference between the operating value and the reference value satisfies the predetermined threshold condition, transmitting a notification indicative of a potential failure of the MOV to at least one device. By way of example, a monitoring component may transmit the notification to at least one device using a communication interface of the monitoring component. For instance, if the MOV is a component of an SPD, a monitoring component may transmit the notification to a computing device of an SPD user (e.g., a computing device protected by the SPD or a computing device of a user that monitors the status of the SPD) over a wired or wireless communication link.

In one instance, the notification may indicate that a particular MOV may potentially fail. In another instance, the notification may indicate that a particular MOV may potentially fail and also indicate the operating value of the parameter monitored by the monitoring component.

In some instances, the notification may indicate a mode of protection of the particular MOV. For instance, the notification may indicate whether the particular MOV is an L-G MOV, L-L MOV, L-N MOV, or N-G MOV. Additionally or alternatively, the notification may indicate a specific potential failure condition.

By way of example, if the monitoring component detects simultaneous current conduction and/or associated heat rise of all three phases' L-G MOVs while one or more L-L MOVs does not draw any current or experience any heat rise, the notification may indicate a potential arcing ground fault. As another example, if the monitoring component detects simultaneous current conduction in all three phases' L-G MOVs in alternating directions, the notification may indicate a potential ferroresonance condition (a phenomenon usually characterized by overvoltages and very irregular wave shapes and associated with the excitation of one or more saturable inductors through capacitance in series with the inductor). Each of the two above scenarios may occur, for instance, in an ungrounded power system.

The notification may also indicate a specific potential failure condition in grounded power systems. As one example, if the monitoring component detects the simultaneous current conduction and/or associated heat rise of two or three phases' L-G MOVs while one or more L-N MOVs do not draw any current or experience any heat rise, the notification may indicate a potential ground reference problem. As another example, if the monitoring component detects simultaneous current conduction and/or heat rise of one or more N-G MOVs, the notification may indicate a potential inappropriate reference to ground problem, suggesting fundamental power system problems. Other examples are also possible.

Further, if the MOV is installed in an SPD, the notification may include an identification of the particular SPD. In yet another instance, the notification may include a log of data regarding the operating value for a time period leading up to the triggering of the notification (e.g., a previous few minutes, hours, or days). Optionally, the notification may also include information regarding the input voltage provided to the SPD by a power source during the time period leading up to the triggering of the notification. Other examples are also possible.

In some instance, the method 400 may include further functions. For instance, optionally, at block 408, the method 400 involves responsive to determining that the difference between the operating value and the reference value satisfies the predetermined threshold condition, triggering a predetermined safety-related action for a power system. By way of example, the predetermined safety-related action may involve causing one or more electronic systems served by an SPD in which the MOV is installed to shutdown to affect an SPD-failure scenario. As another example, the predetermined safety-related action may involve causing one or more electronic systems being served by an SPD to transition to being served by a different power source (e.g., a different power source that is protected by another SPD). Other examples are also possible.

There may be circumstances whereby a power system anomaly that affects an SPD may be undesirable but the consequence of deenergizing the SPD or power system may be worse. In such instances, an operator may choose to sacrifice the SPD rather than affecting a shutdown of the SPD or electronic system being served by the SPD. For example, various power system temporary overvoltages (or sustained overvoltages) may be undesirable. However, deenergizing the power system may nevertheless be unacceptable at any cost. For instance, foundries, various medical or financial or process operations may be better served by sacrificing any SPD(s) in exchange for the continuation of ongoing operations. Note that a failing SPD may still offer limited reduction of temporary overvoltage or sustained voltage effects. Thus, the safety-related actions discussed above are not meant to be limiting.

Figure 6:
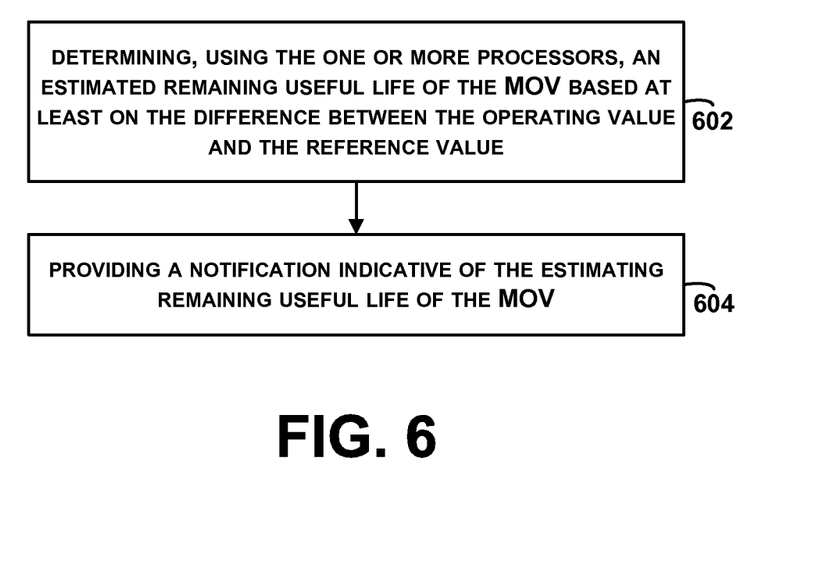
FIG. 6 is a flow chart depicting functions that can be carried out in accordance with the present disclosure.

FIG. 6 is a flow chart depicting functions that can be carried out in accordance with the present disclosure. In one example, the functions may be carried out in conjunction with the method 400 of FIG. 4. Further, the functions may be carried out by the monitoring component 208 of FIG. 2 or one or more components of the monitoring component 208, for example, or generally by any computing device.

As shown in FIG. 6, the function at block 602 involves determining, using one or more processors, an estimated remaining useful life of the MOV based at least on the difference between the operating value and the reference value. And the function at block 604 involves providing a notification indicative of the estimating remaining useful life of the MOV. In some instances, this notification may be a separate notification from the notification of potential MOV failure described above with reference to FIG. 4. In other instances, the notification may be the same notification as the notification of the potential MOV failure. In other words, in some examples, a notification of a potential MOV failure may also include an indication of the estimated remaining useful life of the MOV.

In one embodiment, a monitoring component may determine an estimated remaining useful life based on a measured temperature. By way of example, if the monitoring component detects that an MOV temperature exceeds a first predetermined temperature (e.g., 85° C., the monitoring component may simply provide an alert. Such an alert may take the form of an error code provided within a notification (e.g., Error Code XYZ85). On the other hand, if the monitoring component detects that an MOV temperature exceeds a second predetermined temperature (e.g., 100° C.), the monitoring component may provide a second alert. Such an alert may take the form of a different error code (e.g., Error Code XYZ100), which may be interpreted to mean that, because the temperature exceeds the second threshold, the estimated remaining useful life of the MOV is now 50%. Likewise, if the monitoring component detects that an MOV temperature exceeds a third predetermined temperature (e.g., 110° C.), the monitoring component may provide an alert indicating that the useful life of the MOV has been achieved and the MOV should now be replaced.

In another embodiment, a monitoring component may determine an estimated remaining useful life based on a temperature ratio between the temperature of an MOV and an ambient temperature. For instance, a ratio of MOV temperature to ambient temperature may correspond to a certain percentage reduction in useful life. In one example, the monitoring component may determine a ratio of MOV temperature to ambient temperature for a particular duration of time (e.g., a few seconds), and use a lookup table to determine an estimated remaining useful life corresponding to the ratio. The table below provides a simplified example of such a lookup table.

| Estimated Remaining Useful Life | 100% | 90% | 50% | 0% |
| --- | --- | --- | --- | --- |
| Ambient Temperature = 66-85° C. | 1.1 | 1.3 | 1.5 | 2.0 |
| Ambient Temperature = 46-65° C. | 1.2 | 1.4 | 1.8 | 2.5 |
| Ambient Temperature = 26-45° C. | 1.3 | 1.5 | 1.9 | 2.5 |
| Ambient Temperature = 0-25° C. | 1.4 | 1.6 | 2.0 | 2.5 |
| Ambient Temperature = <0° C. | 1.5 | 1.7 | 2.0 | 2.5 |

As shown in the example table, the estimated remaining useful life may also vary depending on the ambient temperature. For instance, a ratio of 1.3 may be indicative of an estimated remaining useful life of 90% if the ambient temperature is between 66-85° C. However, the same ratio may be indicative of an estimated remaining useful life of 100% if the ambient temperature is less than 45° C.

In other examples, temperature ratios between two MOVs installed in different modes of protection could be determined. For instance, the monitoring component may determine a temperature ratio between L-N or L-L MOVs and L-G MOVs. These temperature ratios may also correspond to an estimated remaining useful life in a similar manner to the temperature ratio between MOV temperature and ambient temperature discussed above.

In still another embodiment, a monitoring component may determine an estimated remaining useful life based on ratio between a continuous (e.g., root mean square) current flow through an MOV and a baseline current. In practice, any continuous current above an experimentally determined baseline value may suggest the presence of a failing MOV. Thus, a ratio of continuous current to baseline current may correspond to a certain percentage reduction in useful life. In one example, the monitoring component may determine a ratio of continuous current to baseline current for a particular duration of time (e.g., a few seconds), and use a lookup table to determine an estimated remaining useful life corresponding to the ratio. The table below provides a simplified example of such a lookup table.

| Estimated Remaining Useful Life | 100% | 90% | 50% | 0% |
| --- | --- | --- | --- | --- |
| Ambient Temperature = 26-85° C. | 1.01 | 1.02 | 1.05 | 1.1 |
| Ambient Temperature = <25° C. | 1.02 | 1.04 | 1.06 | 1.15 |

In some instances, the monitoring component may determine an estimated remaining useful life using a lookup table that is keyed to both a continuous current ratio and a temperature ratio (e.g., MOV temperature to ambient temperature, or first MOV temperature to second MOV temperature).

In yet another embodiment, a monitoring component may determine an estimated remaining useful life for an MOV based on a cumulative (non-root mean square) current flow through the MOV. As an example, the monitoring component may measure the cumulative current flow in Joules (watt seconds) such that low currents for seconds or minutes are considered, as well as high surge currents for microseconds. In one implementation, the estimated remaining useful life may be known to expire upon the passage of a particular number ("X") of joules passing through an MOV. Accordingly, if the monitoring component detects the passage of 25% of X joules through the MOV, the monitoring component may determine that the estimated remaining useful life is 75%; if the monitoring component detects the passage of 50% of X joules through the MOV, the monitoring component may determine that the estimated remaining useful life is 50%; and if the monitoring component detects passage of 75% of X joules through the MOV, the monitoring component may determine that the estimated remaining useful life is 25%. In some instances, this approach may also be combined or coupled with the approaches for estimating remaining useful life described above.

Figure 7:
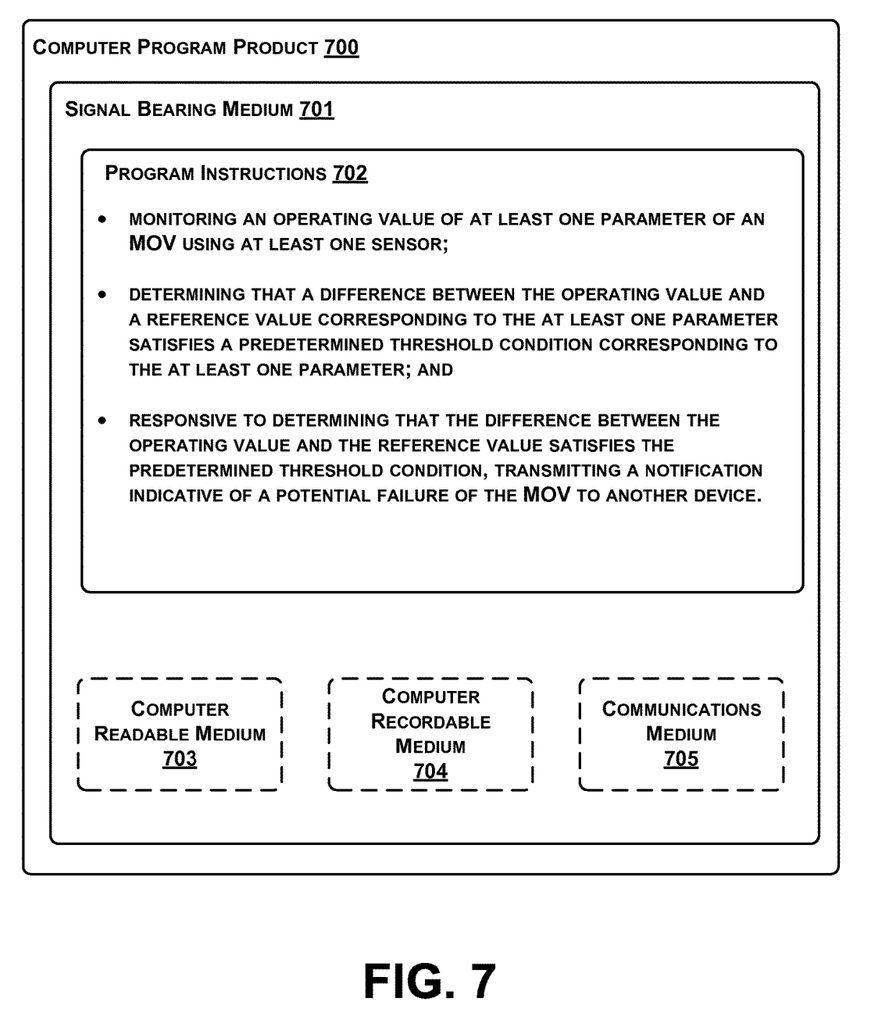
FIG. 7 is a schematic illustrating a conceptual partial view of an example computer program product that includes a computer program for executing a computer process on a computing device, arranged according to at least some embodiments presented herein.

In some embodiments, the disclosed methods may be implemented as computer program instructions encoded on a non-transitory computer-readable storage media in a machine-readable format, or on other non-transitory media or articles of manufacture. FIG. 7 is a schematic illustrating a conceptual partial view of an example computer program product 700 that includes a computer program for executing a computer process on a computing device, arranged according to at least some embodiments presented herein.

In one embodiment, the example computer program product 700 is provided using a signal bearing medium 701. The signal bearing medium 701 may include one or more programming instructions 702 that, when executed by one or more processors may provide functionality or portions of the functionality described above with respect to FIGS. 1-6. In some examples, the signal bearing medium 701 may encompass a computer-readable medium 703, such as, but not limited to, a hard disk drive, a Compact Disc (CD), a Digital Video Disk (DVD), a digital tape, memory, etc. In some implementations, the signal bearing medium 701 may encompass a computer recordable medium 704, such as, but not limited to, memory, read/write (R/W) CDs, R/W DVDs, etc. In some implementations, the signal bearing medium 701 may encompass a communications medium 705, such as, but not limited to, a digital and/or an analog communication medium (e.g., a fiber optic cable, a waveguide, a wired communications link, a wireless communication link, etc.). Thus, for example, the signal bearing medium 701 may be conveyed by a wireless form of the communications medium 705 (e.g., a wireless communications medium conforming with the IEEE 802.11 standard or other transmission protocol).

The one or more programming instructions 702 may be, for example, computer executable and/or logic implemented instructions. In some examples, a computing device such as the monitoring component 208 of FIG. 2 may be configured to provide various operations, functions, or actions in response to the programming instructions 702 conveyed to the monitoring component 208 by one or more of the computer readable medium 703, the computer recordable medium 704, and/or the communications medium 705.

It should be understood that arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims, along with the full scope of equivalents to which such claims are entitled. It is also to be understood that the terminology used herein is for the purpose of describing particular embodiments only, and is not intended to be limiting.

What is claimed is:

1. A method for monitoring the operation of a metal-oxide varistor (MOV), comprising:
    monitoring an operating value of at least one parameter of the MOV using at least one sensor;
    determining, using one or more processors, that a difference between the operating value and a reference value corresponding to the at least one parameter satisfies a predetermined threshold condition corresponding to the at least one parameter;
    determining, using the one or more processors, an estimated remaining useful life of the MOV based at least on an operating temperature of the MOV, and providing an indication of the estimated remaining useful life of the MOV; and
    responsive to determining that the difference between the operating value and the reference value satisfies the predetermined threshold condition, transmitting a notification indicative of a potential failure of the MOV.

2. The method of claim 1, wherein the MOV is a component of a surge protection device (SPD).

3. The method of claim 2, further comprising, responsive to determining that the difference between the operating value and the reference value satisfies the predetermined threshold condition, triggering a predetermined safety-related action for a power system in which the SPD is installed.

4. The method of claim 1, wherein the at least one parameter of the MOV comprises a parameter selected from the group consisting of: a temperature of the MOV; a current flow through the MOV; and a conduction voltage of the MOV.

5. The method of claim 1:
    wherein the at least one parameter of the MOV comprises a temperature of the MOV,
    wherein the reference value corresponding to the temperature of the MOV comprises an ambient temperature, and
    wherein the predetermined threshold condition corresponding to the temperature of the MOV comprises the difference between the operating value of the temperature of the MOV and the ambient temperature being greater than a predetermined threshold.

6. The method of claim 1:
    wherein the at least one parameter of the MOV comprises a current flow through the MOV,
    wherein the reference value corresponding to the current flow through the MOV comprises a reference current flow through a reference MOV known to be operating in a desired manner, and
    wherein the predetermined threshold condition corresponding to the current flow through the MOV comprises the difference between the operating value of the current flow through the MOV and the current flow through the reference MOV being greater than a predetermined threshold.

7. The method of claim 1:
    wherein the at least one parameter of the MOV comprises a current flow through the MOV, wherein the reference value corresponding to the current flow through the MOV comprises a current threshold, and
wherein the predetermined threshold condition corresponding to the current flow through the MOV comprises the current flow through the MOV being greater than the current threshold.

8. The method of claim 1:
wherein the at least one parameter of the MOV comprises a conduction voltage of the MOV,
wherein the reference value corresponding to the conduction voltage of the MOV comprises a reference conduction voltage through a reference MOV known to be operating in a desired manner, and
wherein the predetermined threshold condition corresponding to the conduction voltage of the MOV comprises the difference between the operating value of the conduction voltage of the MOV and the conduction voltage through the reference MOV being greater than a predetermined threshold.

9. The method of claim 1:
wherein the at least one parameter of the MOV comprises a conduction voltage of the MOV,
wherein the reference value corresponding to the conduction voltage of the MOV comprises a nominal voltage of a power system of which the MOV is a component, and
wherein the predetermined threshold condition corresponding to the conduction voltage of the MOV comprises the conduction voltage of the MOV being less than the nominal voltage of the power system.

10. An apparatus for monitoring the operation of a metal-oxide varistor (MOV), comprising:
at least one sensor configured to monitor an operating value of at least one parameter of the MOV;
a communication interface through which the apparatus is configured to transmit notifications; and
a controller arranged to: (i) determine that a difference between the operating value and a reference value corresponding to the at least one parameter satisfies a predetermined threshold condition corresponding to the at least one parameter, (ii) determine an estimated remaining useful life of the MOV based at least on an operating temperature of the MOV, and providing an indication of the estimated remaining useful life of the MOV, and (iii) cause the apparatus to transmit a notification indicative of a potential failure of the MOV to at least one device in response to determining that the difference between the operating value and the reference value satisfies the predetermined threshold condition.

11. The apparatus of claim 10, wherein the MOV is a component of a surge protection device (SPD).

12. The apparatus of claim 11, wherein the controller is further arranged to trigger a predetermined safety-related action for a power system in which the SPD is installed in response to determining that the difference between the operating value and the reference value satisfies the predetermined threshold condition.

13. The apparatus of claim 10, wherein the at least one parameter of the MOV comprises a parameter selected from the group consisting of: a temperature of the MOV; a current flow through the MOV; and a conduction voltage of the MOV.

14. The apparatus of claim 10, wherein the at least one sensor comprises a sensor selected from the group consisting of: a thermocouple, an infrared temperature sensor, an electromechanical sensor, an optomechanical sensor, an electropnuematic sensor, and an electrical sensor.

15. A non-transitory computer-readable medium having stored therein instructions, that when executed by one or more processors of a computing device, cause the computing device to perform functions comprising:
monitoring an operating value of at least one parameter of a metal-oxide varistor (MOV) using at least one sensor;
determining that a difference between the operating value and a reference value corresponding to the at least one parameter satisfies a predetermined threshold condition corresponding to the at least one parameter;
determining, using one or more processors, an estimated remaining useful life of the MOV based at least on an operating temperature of the MOV, and providing an indication of the estimated remaining useful life of the MOV; and
responsive to determining that the difference between the operating value and the reference value satisfies the predetermined threshold condition, transmitting a notification indicative of a potential failure of the MOV.

16. The non-transitory computer-readable medium of claim 15, wherein the at least one parameter of the MOV comprises a parameter selected from the group consisting of: a temperature of the MOV; a current flow through the MOV; and a conduction voltage of the MOV.

17. The non-transitory computer-readable medium of claim 15:
wherein the at least one parameter of the MOV comprises a temperature of the MOV,
wherein the reference value corresponding to the temperature of the MOV comprises an ambient temperature, and
wherein the predetermined threshold condition corresponding to the temperature of the MOV comprises the difference between the operating value of the temperature of the MOV and the ambient temperature being greater than a predetermined threshold.

18. The non-transitory computer-readable medium of claim 15:
wherein the at least one parameter of the MOV comprises a current flow through the MOV,
wherein the reference value corresponding to the current flow through the MOV comprises a current threshold, and
wherein the predetermined threshold condition corresponding to the current flow through the MOV comprises the current flow through the MOV being greater than the current threshold.

19. The non-transitory computer-readable medium of claim 15:
wherein the at least one parameter of the MOV comprises a conduction voltage of the MOV,
wherein the reference value corresponding to the conduction voltage of the MOV comprises a nominal voltage of a power system of which the MOV is a component, and
wherein the predetermined threshold condition corresponding to the conduction voltage of the MOV comprises the conduction voltage of the MOV being less than the nominal voltage of the power system.

20. The method of claim 3, wherein the SPD is served by a first power source, and wherein triggering the predetermined safety-related action comprises:
causing the power system to transition from being served by the first power source to being served by a second power source protected by another SPD.

21. The method of claim 1, further comprising:
determining an ambient temperature of an environment of the MOV, wherein determining the estimated remaining useful life of the MOV is based on a ratio between the operating temperature of the MOV and the ambient temperature, and wherein the estimated remaining useful life varies with the ambient temperature.

22. The method of claim 1, wherein the MOV operates in a first mode of protection, wherein determining the estimated remaining useful life of the MOV is based on a ratio between the operating temperature of the MOV and a respective operating temperature of another MOV operating in a second mode of protection different from the first mode of protection.

23. The method of claim 1, wherein the indication of the estimated remaining useful life of the MOV comprises a first alert indicating that the operating temperature satisfied a first predetermined threshold value, the method further comprising:
when the operating temperature satisfies a second predetermined threshold value, transmitting a second alert indicating a first estimate of remaining useful life of the MOV; and
when the operating temperature satisfies a third predetermined threshold value, transmitting a third alert indicating a second estimate of the remaining useful life of the MOV that is less than the first estimate.

24. The method of claim 1, further comprising:
detecting current conduction for three L-G MOVs, and determining for the three L-G MOVs that a difference between respective operating temperatures of the three L-G MOVs and a reference temperature satisfied a corresponding predetermined threshold condition, while one or more L-L MOVs operate normally; and
including in the notification an indication of a potential arcing ground fault.

25. The method of claim 1, further comprising:
detecting, for three L-G MOVs associated with corresponding three phases, current conduction in alternating directions; and
including in the notification an indication of a ferroresonance condition.

26. The method of claim 1, further comprising:
detecting current conduction for two or more L-G MOVs corresponding to two or more phases, while determining that one or more L-N MOVs operate normally; and
including in the notification an indication of a potential ground reference fault.

* * * * *